(12) United States Patent
Cheng et al.

(10) Patent No.: US 7,476,578 B1
(45) Date of Patent: Jan. 13, 2009

(54) PROCESS FOR FINFET SPACER FORMATION

(75) Inventors: Kangguo Cheng, Beacon, NY (US); Xi Li, Somers, NY (US); Richard S. Wise, Newburgh, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/776,710

(22) Filed: Jul. 12, 2007

(51) Int. Cl.
*H01L 21/00* (2006.01)

(52) U.S. Cl. ........................... 438/154; 257/369

(58) Field of Classification Search .......... 438/154, 438/157, 158, 176, 199, 283; 257/241, 331, 257/369, 351, E29.275
See application file for complete search history.

(56) References Cited

U.S. PATENT DOCUMENTS

| | | | |
|---|---|---|---|
| 5,793,082 A | 8/1998 | Bryant | |
| 6,413,802 B1 | 7/2002 | Hu et al. | |
| 6,774,437 B2 | 8/2004 | Bryant et al. | |
| 6,838,322 B2 | 1/2005 | Pham et al. | |
| 6,924,178 B2 | 8/2005 | Beintner | |
| 6,946,377 B2 | 9/2005 | Chambers | |
| 6,951,783 B2 | 10/2005 | Mathew et al. | |
| 6,951,784 B1 | 10/2005 | Anderson et al. | |
| 7,056,773 B2 * | 6/2006 | Bryant et al. | 438/142 |
| 7,105,390 B2 | 9/2006 | Brask et al. | |
| 2006/0180866 A1 | 8/2006 | Zhu et al. | |
| 2007/0057325 A1 | 3/2007 | Hsu et al. | |
| 2007/0082437 A1 | 4/2007 | Cheng et al. | |

* cited by examiner

*Primary Examiner*—David Vu
(74) *Attorney, Agent, or Firm*—Cantor Colburn LLP; Yuanmin Cai

(57) ABSTRACT

A process for finFET spacer formation generally includes depositing, in order, a conformal liner material, a conformal spacer material, and a conformal capping material onto the finFET structure; tilt implanting dopant ions into portions of the capping layer about the gate structure; selectively removing undoped capping material about the source and drain regions; selectively removing exposed portions of the spacer material; selectively removing exposed portions of the capping material; anisotropically removing a portion of the spacer material so as to expose a top surface of the gate material and isolate the spacer material to sidewalls of the gate structure; and removing the oxide liner from the fin to form the spacer on the finFET structure.

6 Claims, 8 Drawing Sheets

US 7,476,578 B1

PROCESS FOR FINFET SPACER FORMATION

BACKGROUND OF THE INVENTION

1. Field of the Invention

This invention generally relates to finFET spacer formation.

2. Description of the Background

The term FinFET generally refers to a nonplanar, double-gate transistor. Integrated circuits that include FinFETs may be fabricated on a bulk silicon substrate or, more commonly, on a silicon-on-insulator (SOI) wafer that includes an active SOI layer of a single crystal semiconductor, such as silicon, a semiconductor substrate, and a buried insulator layer, e.g., a buried oxide layer that separates and electrically isolates the semiconductor substrate from the SOI layer. Each FinFET generally includes a narrow vertical fin body of single crystal semiconductor material with vertically-projecting sidewalls. A gate contact or electrode intersects a channel region of the fin body and is isolated electrically from the fin body by a thin gate dielectric layer. At opposite ends of the fin body are heavily-doped source/drain regions.

Conventional methods of forming the fin body utilize subtractive techniques in which a uniformly thick layer of single crystal silicon is patterned by masking and etching with a process like reactive ion etching (RIE). The width of the fin body is related to the line width of a resist mask or a hard mask. The nominal line width is specified either by photolithographic techniques or by sidewall image transfer from an overlying spacer but may be influenced by other factors. Forming the spacer around the gate is essential for finFET fabrication. However, given the three dimensional structure of the finFET, current processes for forming the finFET are difficult to employ because the spacer is undesirably formed about the source and the drain regions.

Accordingly, there is a need for fabrication processes for spacer formation in finFET structures.

SUMMARY OF THE INVENTION

The shortcomings of the prior art are overcome and additional advantages are provided through the provision of a process for forming the spacer in the finFET structure. The process includes providing a finFET structure free of a spacer material, the finFET structure comprising at least one vertical fin body formed of a single crystal semiconductor material with vertically-projecting sidewalls, source and drain regions at opposite ends of the fin body; and a gate structure intersecting a channel region of the fin body and electrically isolated from the fin body; depositing, in order, a conformal liner material, a conformal spacer material, and a conformal capping material onto the finFET structure; tilt implanting dopant ions into portions of the capping layer about the gate structure; selectively removing undoped capping material about the source and drain regions; selectively removing exposed portions of the spacer material; selectively removing exposed portions of the capping material; anisotropically removing a portion of the spacer material so as to expose a top surface of the gate material and isolate the spacer material to sidewalls of the gate structure; and removing the liner from the fin to form the spacer on the finFET structure.

Additional features and advantages are realized through the techniques of the present invention. Other embodiments and aspects of the invention are described in detail herein and are considered a part of the claimed invention. For a better understanding of the invention with advantages and features, refer to the description and to the drawings.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

The detailed description explains the preferred embodiments of the invention, together with advantages and features, by way of example with reference to the drawings.

Disclosed herein are processes for forming the spacer of a finFET structure. It should be noted, however, that the processes described herein for forming the spacer are equally applicable to any fin-based, multigate transistor architecture regardless of number of gates. Moreover, the present invention may be practiced in conjunction with a various integrated circuit techniques that are conventionally used in the art, and only so much of the commonly practiced process steps are included herein as much as necessary to provide an understanding the present invention.

Figure 1:
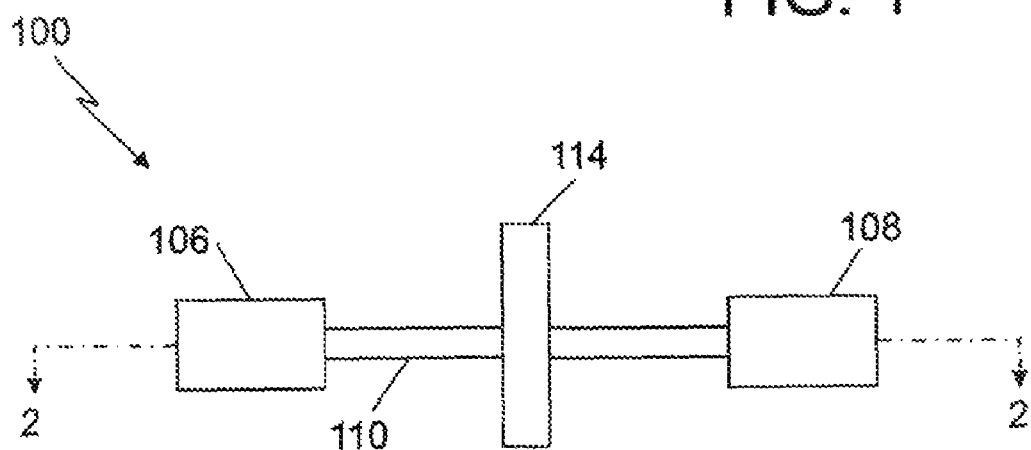
FIG. 1 illustrates a top down view of a finFET structure.
Figure 2:
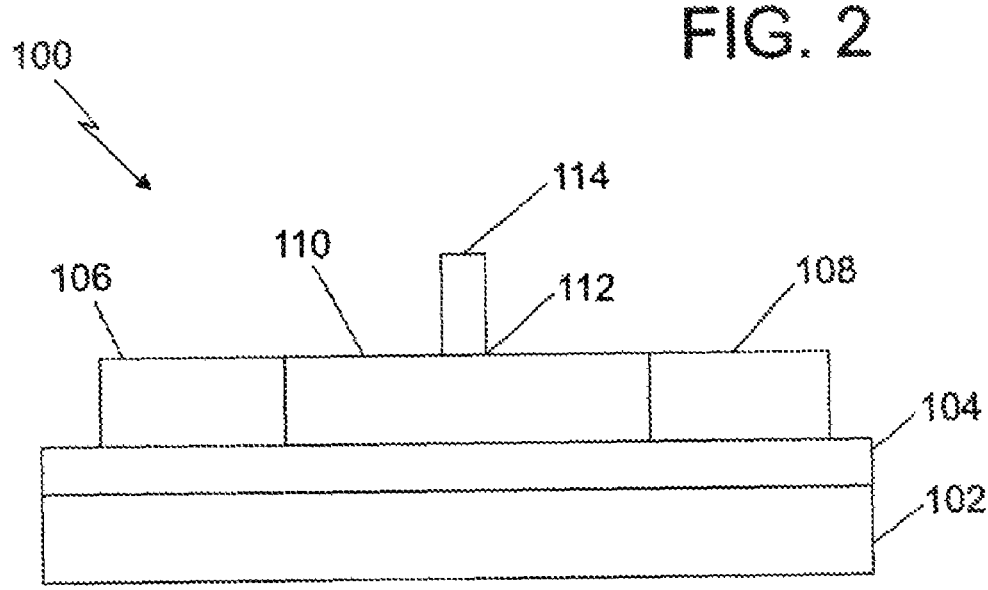
FIG. 2 illustrates a cross sectional view of a finFET structure taken along lines 2-2 of FIG. 1.

As shown in FIGS. 1 and 2, the illustrated finFET structure, generally designated by reference numeral 100, is fabricated on a silicon substrate 102 having a buried oxide layer 104 and includes a silicon source island 106 and a drain island 108 connected by a silicon fin 110. The source, drain, and fin are covered by a dielectric layer 112 (hard mask), and a gate 114 is formed that extends across the fin 110. The fin is isolated from gate 114 by gate oxide and the hard mask 112. The gate 114 may comprise an oxide (i.e., $SiO_2$) grown from either a dry oxygen ambient or steam or a deposited layer of $SiO_2$. Alternatively, the gate dielectric 114 may be formed from any of the many candidate high dielectric constant (high-k) materials, including but not limited to $Si_3N_4$, silicon oxynitride ($SiO_xN_y$), a gate dielectric stack of $SiO_2$ and $Si_3N_4$, and metal oxides like $Ta_2O_5$, as recognized by persons of ordinary skill in the art. The fin 110 extends horizontally on the substrate with the gates in planes on either side of the fin.

Figure 3:
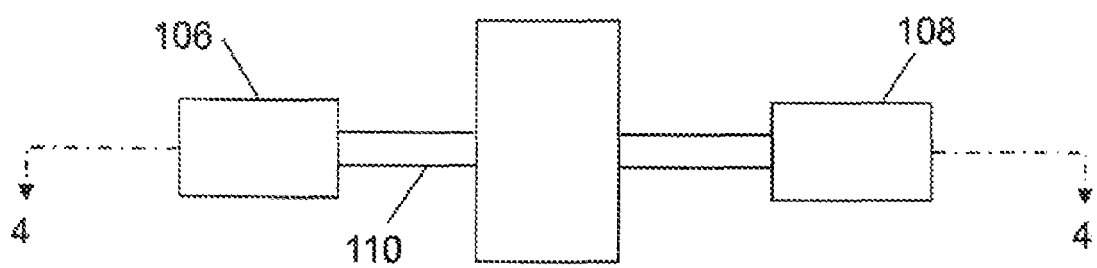
FIG. 3 illustrates a top down view of the finFET structure of FIG. 1 after deposition of a liner layer, a spacer layer, and a capping layer.
Figure 4:
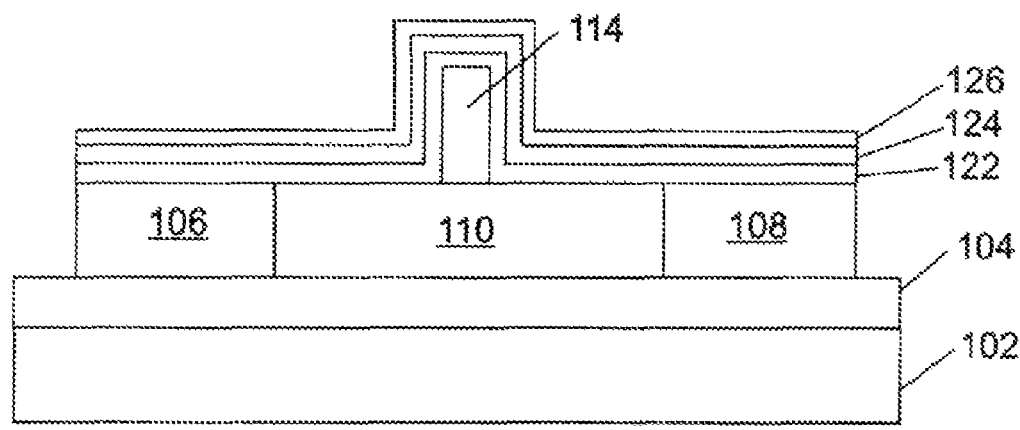
FIG. 4 illustrates a cross sectional view of the finFET structure taken along lines 4-4 of FIG. 3.

The following discussion illustrates a method of fabricating a spacer for the structure shown in FIGS. 1 and 2. In FIGS. 3 and 4, a liner layer 120, a spacer layer 122, and a capping layer 124 are conformally deposited onto the finFET structure 100. By way of example, the liner layer can be an oxide material; the spacer layer may be formed of nitride (e.g., $Si_3N_4$); and the capping layer is polysilicon. The conformal deposition of the various layers can be deposited by a conventional deposition process, such as chemical vapor deposition (CVD) or plasma-assisted CVD. The polysilicon layer can be deposited, for example, under the condition of 1 Torr and 620° C. in the mixed gas of $SiH_4$, $N_2$, and $H_2$.

Figure 5:
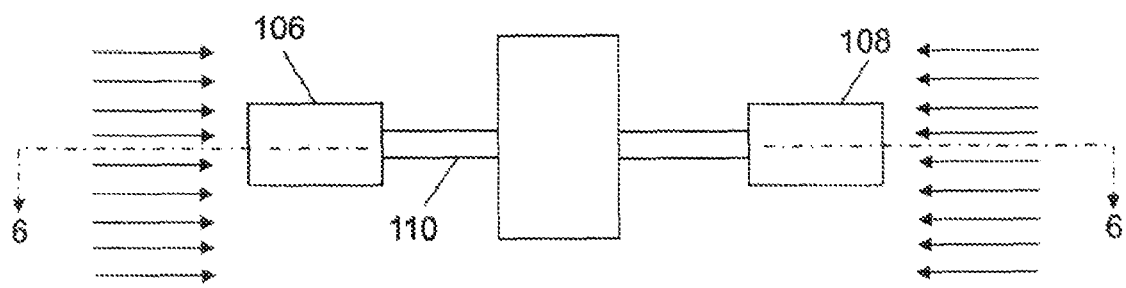
FIG. 5 illustrates a top down view of the finFET structure after tilted ion implantation of dopants in to the capping layer disposed about the gate.
Figure 6:
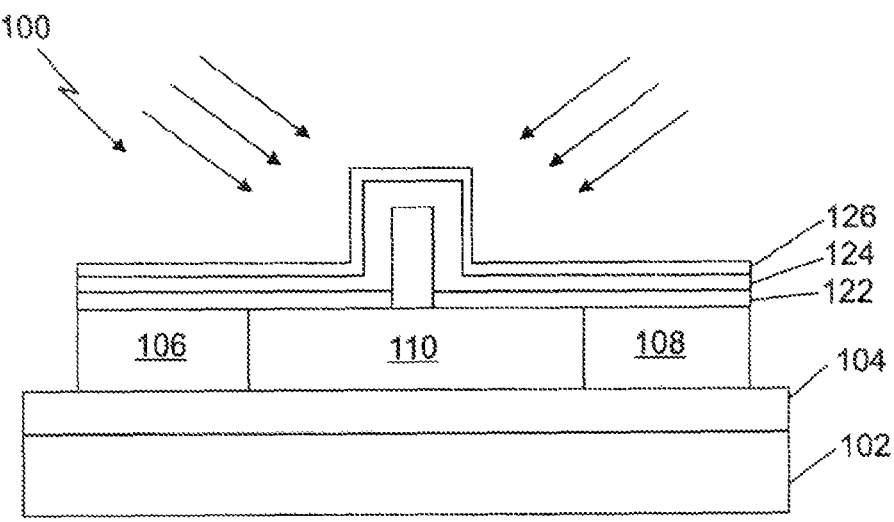
FIG. 6 illustrates a cross sectional view of the finFET structure taken along lines 6-6 of FIG. 5.

In FIGS. 5 and 6, tilted ion implantation of the capping layer 126 about the gate structure 114 is illustrated. To that end, a high concentration of a dopant is tilt implanted by implantation. The dopant may be selected from boron (B), borofluoride ($BF_2$) or a combination of these elements, and may be introduced at an atomic concentration ranging from about 1E18 to 2E20 $cm^{-3}$ to about $cm^{-3}$.

Figure 7:
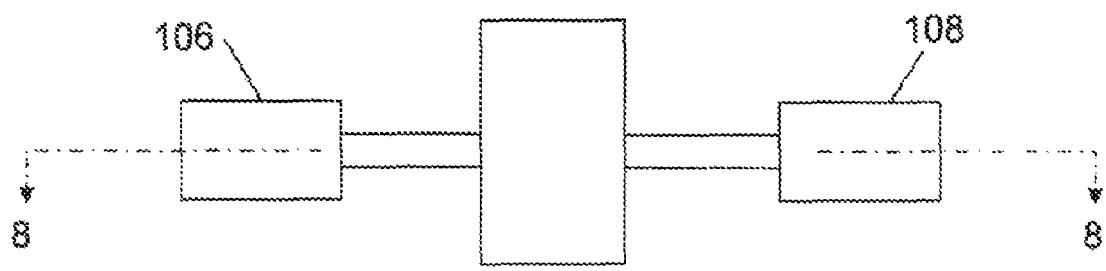
FIG. 7 illustrates a top down view of the finFET structure after selective removal of undoped capping layer about the source and drain regions.
Figure 8:
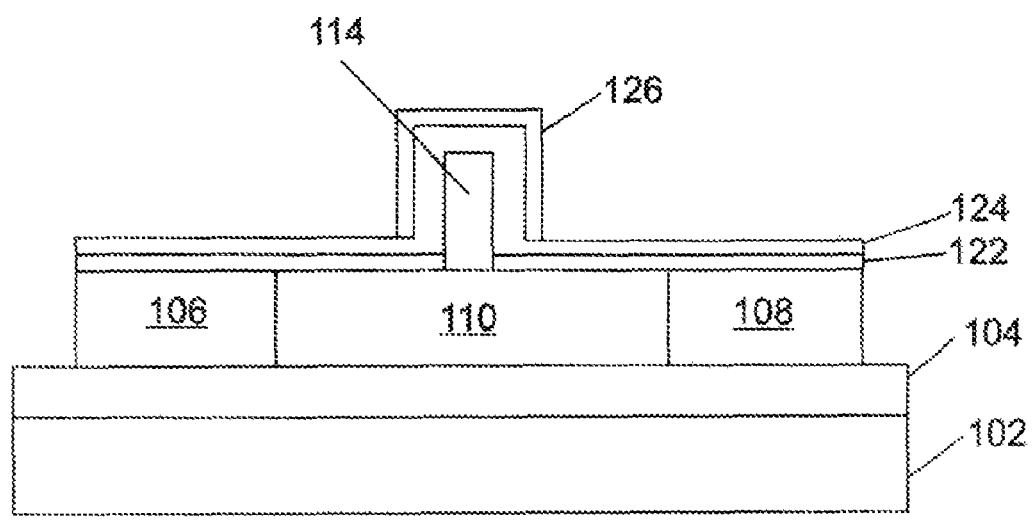
FIG. 8 illustrates a cross sectional view of the finFET structure taken along lines 8-8 of FIG. 7.

In FIGS. 7 and 8, the undoped capping layer 126 is selectively removed from about the source and drain regions 106, 108, thereby exposing the underlying spacer layer 124 in those areas. The undoped portions of the capping layer 126 can be removed using a selective etch process.

Figure 9:
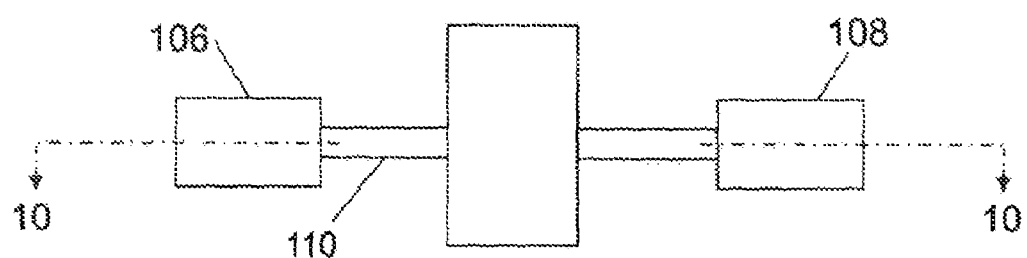
FIG. 9 illustrates a top down view of the finFET structure after removal of the exposed spacer layer.
Figure 10:
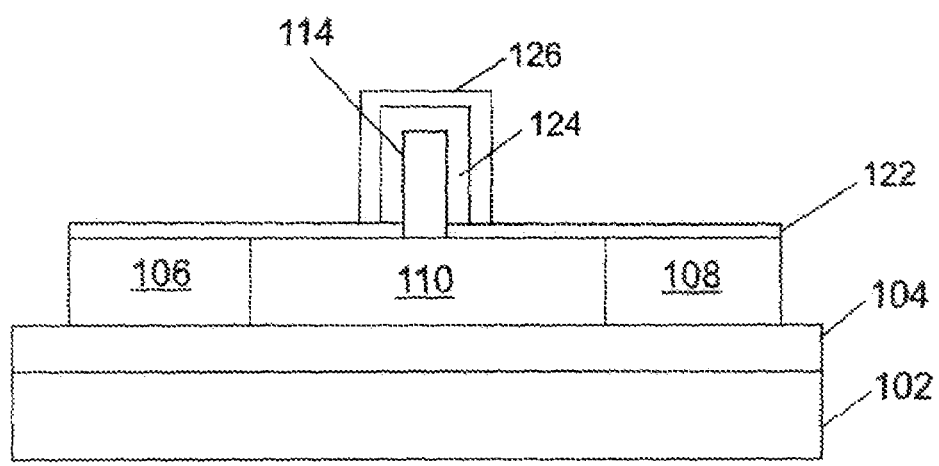
FIG. 10 illustrates a cross sectional view of the finFET structure taken along lines 10-10 of FIG. 9.

In FIGS. 9 and 10, the exposed portions of the spacer layer 124 about the source and drain regions 106, 108 is selectively removed with an anisotropic etch process such as by RIE, thereby exposing portions of the liner layer 122, i.e., exposing portions of the liner layer 122 about the source and drain regions 106, 108.

Figure 11:
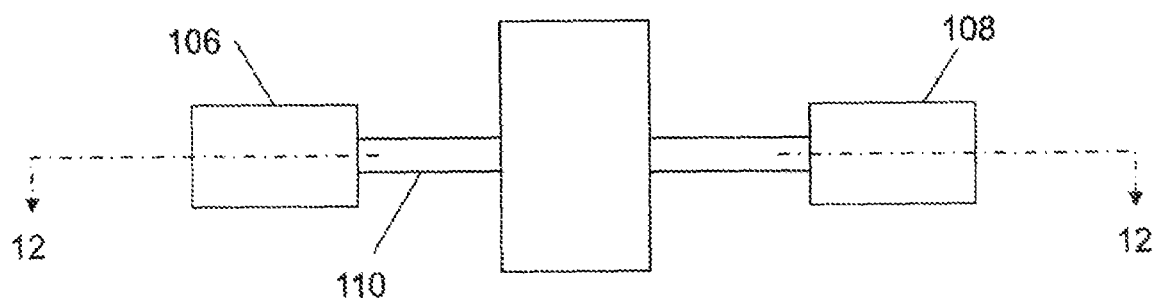
FIG. 11 illustrates a top down view of the finFET structure after removal of the capping layer.
Figure 12:
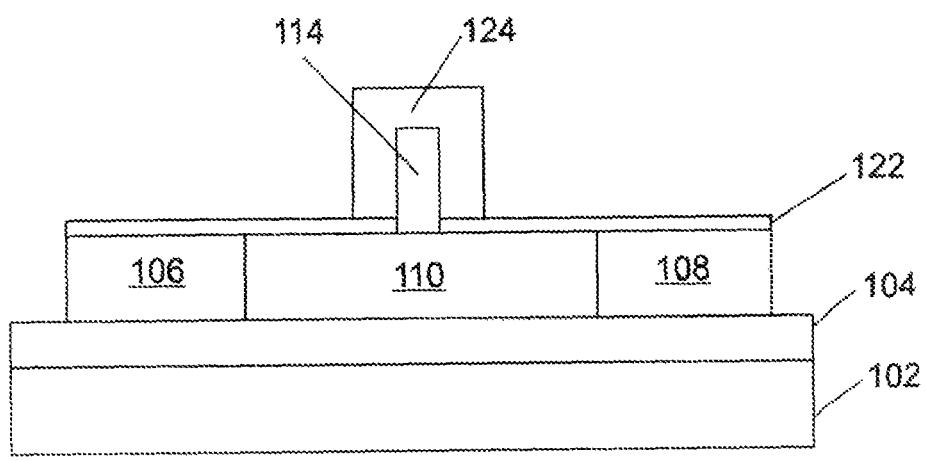
FIG. 12 illustrates a cross sectional view of the finFET structure taken along lines 12-12 of FIG. 11.

In FIGS. 11 and 12, the capping layer 122 is then removed from the gate structure to expose the spacer layer 124 on the gate structure 114.

Figure 13:
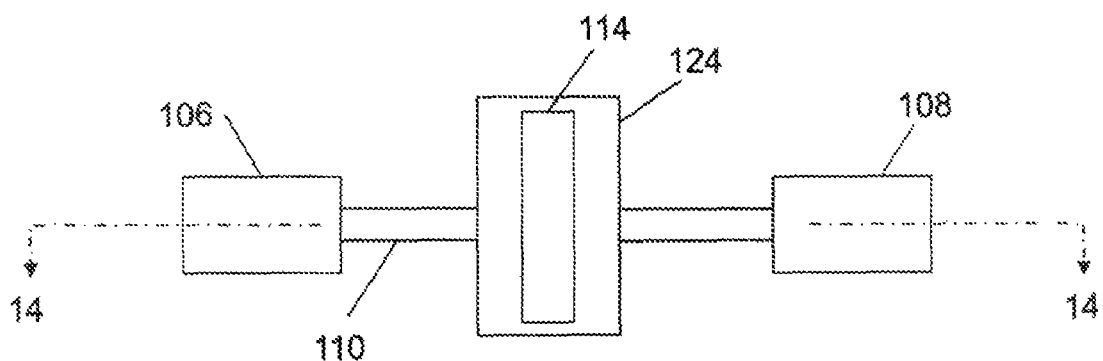
FIG. 13 illustrates a top down view of the finFET structure after removal of the spacer layer to expose the gate structure.
Figure 14:
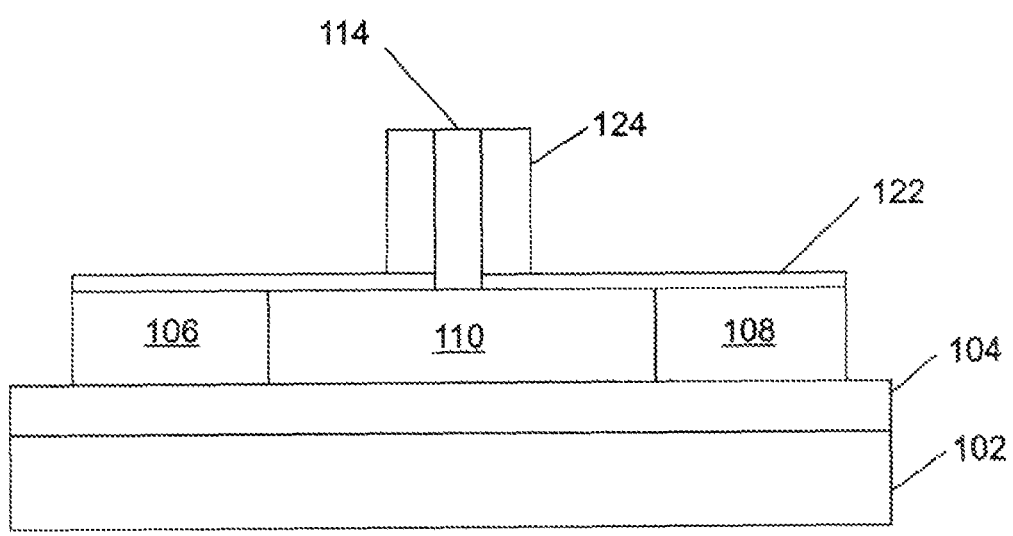
FIG. 14 illustrates a cross sectional view of the finFET structure taken along lines 14-14 of FIG. 13.

In FIGS. 13 and 14, a portion of the spacer layer 124 is removed by RIE so as to expose the gate polysilicon structure 114 while maintaining the spacer layer 124 on sidewalls of gate structure 114.

Figure 15:
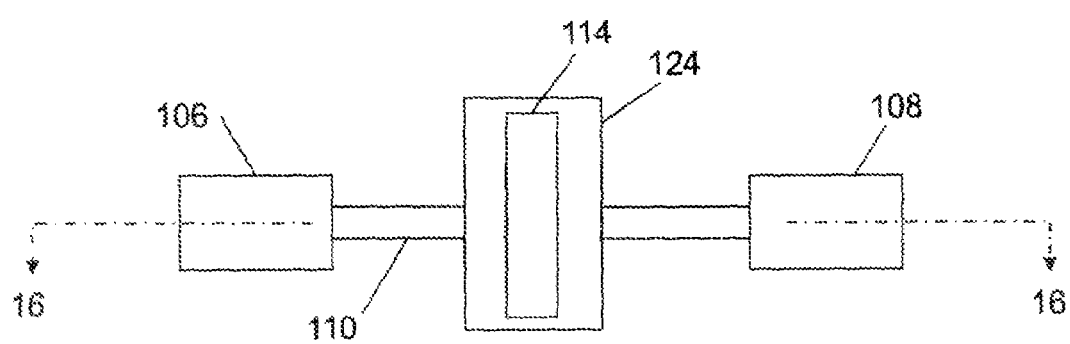
FIG. 15 illustrates a top down view of the finFET structure after removal of the liner layer.
Figure 16:
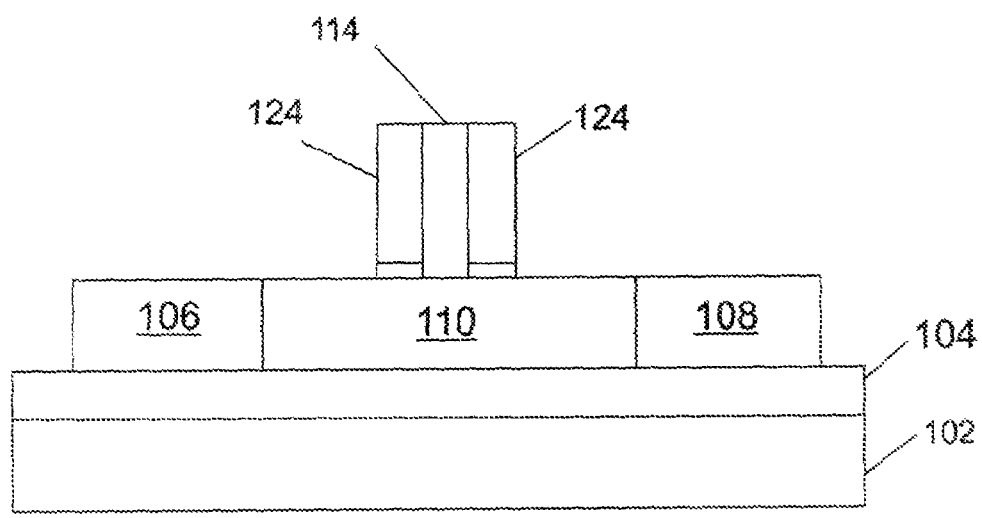
FIG. 16 illustrates a cross sectional view of the finFET structure taken along lines 16-16 of FIG. 15.

In FIGS. 15 and 16, the remaining liner material is removed so as to form the spacer using oxide selective plasma etches or wet etches (e.g. hot phosphoric acid).

In summary, the process generally includes conformally depositing on a finFET structure a liner layer, spacer layer and polysilicon layer; implanting ions into the polysilicon surrounding the gate; selectively removing undoped poly about the source and drain regions; removing the exposed spacer film, removing the doped polysilicon film; and removing a portion of the spacer layer such that the gate material is exposed.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A process for forming a spacer on a finFET structure, comprising:
   providing a finFET structure free of a spacer material, the finFET structure comprising at least one vertical fin body formed of a single crystal semiconductor material with vertically-projecting sidewalls, source and drain regions at opposite ends of the fin body; and a gate structure intersecting a channel region of the fin body and electrically isolated from the fin body;
   depositing, in order, a conformal liner material, a conformal spacer material, and a conformal capping material onto the finFET structure;
   tilt implanting dopant ions into portions of the capping layer about the gate structure;
   selectively removing undoped capping material about the source and drain regions;
   selectively removing exposed portions of the spacer material;
   selectively removing exposed portions of the capping material;
   anisotropically removing a portion of the spacer material so as to expose a top surface of the gate material and isolate the spacer material to sidewalls of the gate structure; and
   removing the liner from the fin to form the spacer on the finFET structure.

2. The elements of claim 1 wherein the capping layer is polysilicon.

3. The elements of claim 1, wherein the spacer layer is a nitride.

4. The elements of claim 1, wherein anisotropically removing the portion of the spacer material comprises a RIE process.

5. The elements of claim 1 wherein the liner material is an oxide.

6. The elements of claim 1, wherein the dopant ions are generated from B, $BF_2$ and combinations thereof.

* * * * *